United States Patent [19]
Tanaka et al.

[11] Patent Number: 5,525,160
[45] Date of Patent: Jun. 11, 1996

[54] FILM DEPOSITION PROCESSING DEVICE HAVING TRANSPARENT SUPPORT AND TRANSFER PINS

[75] Inventors: Sumi Tanaka; Yuichiro Fujikawa; Tomihiro Yonenaga, all of Yamanashi-ken; Hideki Lee, Nirasaki, all of Japan

[73] Assignee: Tokyo Electron Kabushiki Kaisha, Tokyo, Japan

[21] Appl. No.: 237,369

[22] Filed: May 3, 1994

[30] Foreign Application Priority Data

| May 10, 1993 | [JP] | Japan | 5-132595 |
| May 10, 1993 | [JP] | Japan | 5-132596 |
| May 18, 1993 | [JP] | Japan | 5-139467 |

[51] Int. Cl.⁶ ............................................. C23C 16/00
[52] U.S. Cl. ........................... 118/728; 118/725; 118/729; 118/500
[58] Field of Search ............................ 118/725, 728, 118/729, 715, 500

[56] References Cited

U.S. PATENT DOCUMENTS

| 4,854,263 | 8/1989 | Chang | 118/715 |
| 4,949,671 | 8/1990 | Davis | 118/725 |
| 5,000,113 | 3/1991 | Wang | 118/723 |
| 5,148,714 | 9/1992 | McDiarmid | 74/89.15 |
| 5,192,371 | 3/1993 | Shuto | 118/728 |
| 5,332,442 | 7/1994 | Kubodera | 118/725 |
| 5,372,648 | 12/1994 | Yamamoto | 118/723 E |

FOREIGN PATENT DOCUMENTS 5-30298  5/1993  Japan.

Primary Examiner—R. Bruce Breneman
Assistant Examiner—Jeffrie R. Lund
Attorney, Agent, or Firm—Beveridge, DeGrandi, Weilacher & Young

[57] ABSTRACT

A processing chamber having a heating device for heating the interior thereof to a required temperature, and a holding device with at least three separate holding elements is disclosed. A processing gas feed port and processing gas passages are provided in a cap which is connected to a processing chamber and closes an opening in the upper surface of the processing chamber, and the processing gas feed port and the processing gas passages are connected by a connection pipe. The processing chamber is connected to processing gas sources and has processing gas introduction passages formed in a side wall thereof and communicated with the processing gas passages. Seal members are provided around open ends of either of the processing gas passages or the processing gas introduction passages in the surfaces of the processing chamber and the cap opposed to each other. Thus generation of particles can be precluded in the processing gas feed unit, and smooth supply of processing gases, improved yields and throughputs, and easy maintenance operation can be attained.

4 Claims, 15 Drawing Sheets

FIG. I 5,525,160

FILM DEPOSITION PROCESSING DEVICE HAVING TRANSPARENT SUPPORT AND TRANSFER PINS

BACKGROUND OF THE INVENTION

The present invention relates to a film deposition processing device, specifically to a film deposition processing device for supplying a processing gas to an object to be processed, such as a semiconductor wafer or others, to form a thin film on the surface of the object.

Generally in fabricating semiconductor devices, to form integrated circuits on the surfaces of semiconductor wafers to be processed (hereinafter called "wafers") steps of forming thin films on the surfaces of the wafers are conducted by sputtering devices and CVD devices.

In such thin film forming, it is necessary to uniformly grow a thin film on the surface of a wafer where that the entire surface is uniformly heated to a required temperature and retained at the temperature, and then processing gases are fed to the wafer. It is also necessary that instruments, etc. disposed in the processing vessel can be repaired or replaced from the outside to facilitate maintenance and inspection of the film deposition processing device.

The conventional film deposition processing device of this kind mainly comprises, as shown in FIG. 19, a processing chamber 10 having the upper surface opened, where it receives a wafer W at a set position, a cap 20 for opening and closing the opening 11 of the processing chamber 10, and heating means 30, e.g., a heating lamp or others, disposed below the processing chamber 10. A processing gas feeding port 21 is formed in the center of the cap 20 which is connected to processing gas feeding means through a flexible tube 60. An exhaust port 12 is formed in a side of the processing chamber 10. The interior of the processing chamber 10 is evacuated by exhaust means (not shown) connected to the exhaust port 12. In forming a thin film on a wafer by the conventional film deposition processing device of such structure, the interior of the processing chamber is heated to a required temperature by the heating means 30 with the wafer W loaded into the processing chamber 10 by a carrier arm (not shown) supported by a support pin 13, while processing gases from the processing gas feeding means are fed onto the wafer W through the processing gases feeding port 21, so as to conduct film deposition processing. When the processing is over, the feeding of the processing gases, and the heating by the heating means 30 are stopped, the processing gases are exhausted from the processing chamber 10, and the wafer W is unloaded out of the processing chamber 10. After the wafer W is unloaded out of the processing chamber 10, a purging gas is fed into the processing chamber 10 in place of the processing gases to remove components of the processing gases which have stayed on the interior of the processing chamber during the film deposition processing, and the interior of the processing chamber 10 is always maintained in its optimum condition. When the film deposition processing device is repaired or inspected, the cap 20 is swung upward by means of a hinge or others to open the opening 11 of the processing chamber to repair or inspect instruments, etc. in the processing chamber 10.

But the conventional film deposition processing device of such structure has a risk. That is, for maintenance, such as repairs, inspections, etc., of the device the cap 20 is swung to open the opening 11 of the processing chamber 10, and every time the cap is swung open, the flexible tube 60 interconnecting the processing gases feeding port 21 of the cap 20 and the processing gases feeding means is bent. Repeated opening and closure of the cap 20 will generate particles from the inside of the flexible tube, and the particles will be scattered onto the wafer W to pollute the wafer W. Another risk is that repeated opening and closure will deform and crack the flexible tube 60 and leak the processing gases.

The conventional film deposition processing device of such structure has a transfer pin 13d in addition to the support pin 13c on the side of the underside of the wafer W. The underside of the wafer W is heated with radiation from the heating means 30 which is blocked by the support pin 13c and the transfer pin 13d. A problem with this is that the wafer W has an accordingly nonuniform temperature distribution as shown in FIG. 21, and a film formed on the surface of the wafer W has a nonuniform thickness. It is needed that the support pin 13c and the transfer pin 13d are positioned not to interfere with each other for efficient transfer of the wafer W.

SUMMARY OF THE INVENTION

The present invention was made in consideration of the above-described problems, and an object of the present invention is to provide a sheet-type film deposition processing device which can smoothly feed processing gases, can suppress generation of particles in the processing gas feeding system as much as possible, and can realize higher yields and throughputs.

To achieve the above-described object of the present invention, the film deposition processing device according to the present invention comprises a processing chamber for accommodating an object to be processed in position, and having an opening in a top thereof; a cap for closing the opening; processing gas feed means for feeding a processing gas to the object to be processed from the side of the cap; processing gas feed port provided in the cap for introducing the processing gas into the processing chamber; processing gas passages provided in the cap, and communicating with the processing gas feed port; processing gas introduction passages formed in a side wall of the processing chamber, and communicating with the processing gas passages; and seal members for sealing the processing gas passages in either of the upper surfaces of the processing chamber and the cap which are opposed each other, or peripheries of open ends of the processing gas introduction passages.

The film deposition processing device according to the present invention comprising a processing chamber for accommodating an object to be processed in position, and having an opening in a top thereof; a cap for closing the opening; processing gas feed means for feeding a processing gas to the object to be processed from the side of the cap, the cap including a cap base connected to the upper surface of the processing chamber, and a processing gas guide portion connected to a processing gas feeding side of the cap base through an insulating member; there being provided processing gas rectifying means at a position in the processing gas guide portion opposed to the object to be treated; high-frequency power being applied between the processing gas rectifying means and the processing chamber.

In the film deposition processing device of the above-described structure, the processing gas feed port in the cap is connected to the processing gas passages which are connected by the connection pipe, whereby the processing gas guide portion is free from bends and deformation when the cap is swung for opening and closing. As a result generation of particles, etc in the processing gas feed unit can be precluded. The seal members are provided around the open ends of either of the processing gas passages and the processing gas introduction passages in the surfaces of the processing chamber and the cap which are opposed to each other, whereby the processing gas introduction passages and the processing gas passages can be air-tightly connected when in use. As a result processing gases can be smoothly fed.

Outer seal members are provided on the outer peripheries of the seal members on either of the surfaces of the processing chamber and the cap which are opposed to each other, whereby even if processing gases should leak at the seal members, the outer seal members could prevent the leakage of the processing gases outside.

DETAILED DESCRIPTION OF PREFERRED EMBODIMENTS

Figure 1:
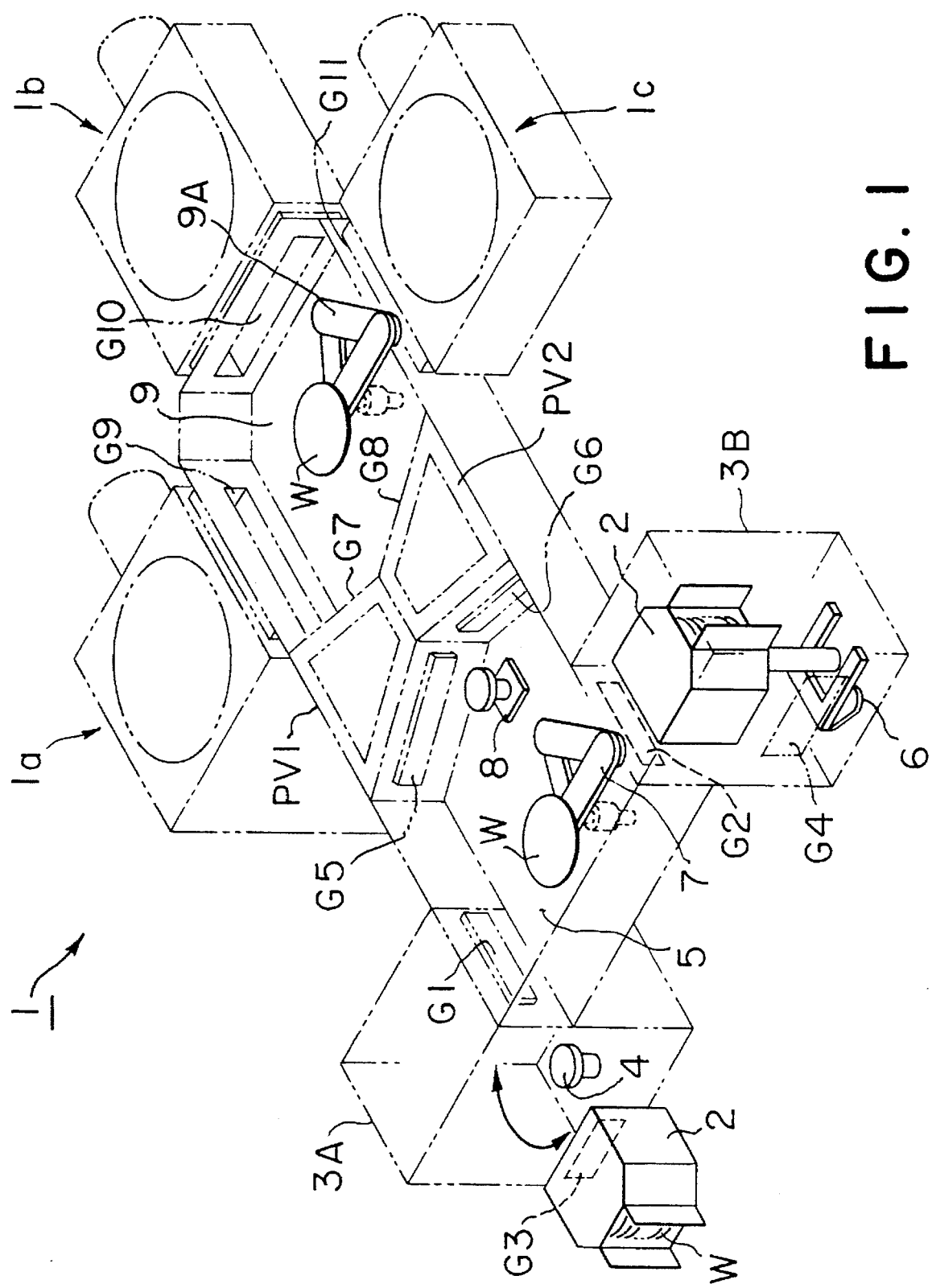
FIG. 1 is a schematic general perspective view of the cluster device incorporating the film deposition processing device according to the present invention.

A CVD device 1 as an embodiment of the film deposition processing device according to the present invention is a part of a cluster device of FIG. 1. The CVD device 1 comprises a first to a third, three vacuum processing chambers, e.g., CVD device (film deposition processing device) 1a and vacuum processing device 1b, 1c disposed commonly adjacent to a second transfer chamber 9, a first transfer chamber 5 connected to the first transfer chamber through a first and a second preliminary vacuum chamber 35 PV1, PV2 disposed commonly adjacent to the second transfer chamber 9, and a first and a second cassette chamber 3A, 3B disposed commonly adjacent to the first transfer chamber 5.

The vacuum processing devices 1a, 1b, 1c constitute an assembly for continuously processing the surface of a semiconductor wafer to be processed. The first vacuum processing device (the film deposition processing device of the present invention) is for depositing, e.g., a tungsten layer on a micronized pattern by CVD. The second vacuum processing device 1b is for depositing, e.g., a titanium film on the wafer with the micronized pattern formed on at 400°–500° C. by sputtering. The third vacuum processing device 1c is for etching the tungsten layer.

This cluster device 1 will be generally explained. The first cassette chamber 3A and the second cassette chamber 3B are connected to the first transfer chamber respectively on both sides thereof through respective gate valves G1, G2. These cassette chambers 3A, 3B constitute wafer boats of the cluster device and accommodate respective cassette stages which are movable up and down.

The first transfer chamber 5, and both cassette chambers 3A, 3B have air-tight structures. Both cassette chambers 3A, 3B have respective gate doors G3, G4 for admitting and shutting an ambient atmosphere in an outside operational room, and respective loading/unloading robots 6 having respective bracket-shaped holding members. As shown in FIG. 1, each robot 6, 6 loads a wafer cassette 2, 2 which has been set faced forward outside the device into the associated cassette chamber 3A, 3B and sets the wafer cassette 2, 2 to be faced to a side. The wafer cassette 2, 2 loaded into the cassette chambers 3A, 3B are pushed by the associated cassette stages 4, 4 up to a set position.

In the first transfer chamber 5 there are provided first transfer means 7 in the form of a carrier arm provided by, e.g., an articulated arm, a rotary stage 8 for aligning a center of a semiconductor wafer W with an orientation flat. The rotary stage 8 comprises the aligning means including a light emitting unit and a light detecting unit.

The first transfer means 7 is for transferring a wafer W between the cassettes 4 in the cassette chambers 3A, 3B and the preliminary vacuum chambers PV1, PV2. An arm of the first transfer means 7, which is a wafer holding portion, has suction holes formed in both sides of the forward end thereof for vacuum-sucking a wafer W. The first preliminary vacuum chamber PV1 and the second preliminary vacuum chamber PV2 are connected to the rear of the first transfer chamber 7 through their associated gate valves G7, G8. Each preliminary vacuum chamber PV1, PV2 accommodates a wafer mount (wafer holding means), heating means for heating the wafer held by the wafer mount, and cooling means for cooling the wafer.

The second transfer chamber 9 is connected to the rears of the first and the second preliminary vacuum chambers PV1, PV2 through gate valves G7, G8.

In the second transfer chamber 9 there is provided second transfer means (carrier arm) in the form of, e.g., an articulated arm for transferring a wafer W between the first and the second preliminary vacuum chambers PV1, PV2 and the three vacuum processing devices 1a, 1b, 1c.

The three vacuum processing devices 1a, 1b, 1c are connected to the three sides of the second transfer chamber 9, the left and the right sides, and the rear side thereof through associated gate valves G9, G10, G11.

[First Embodiment]

Figure 2:
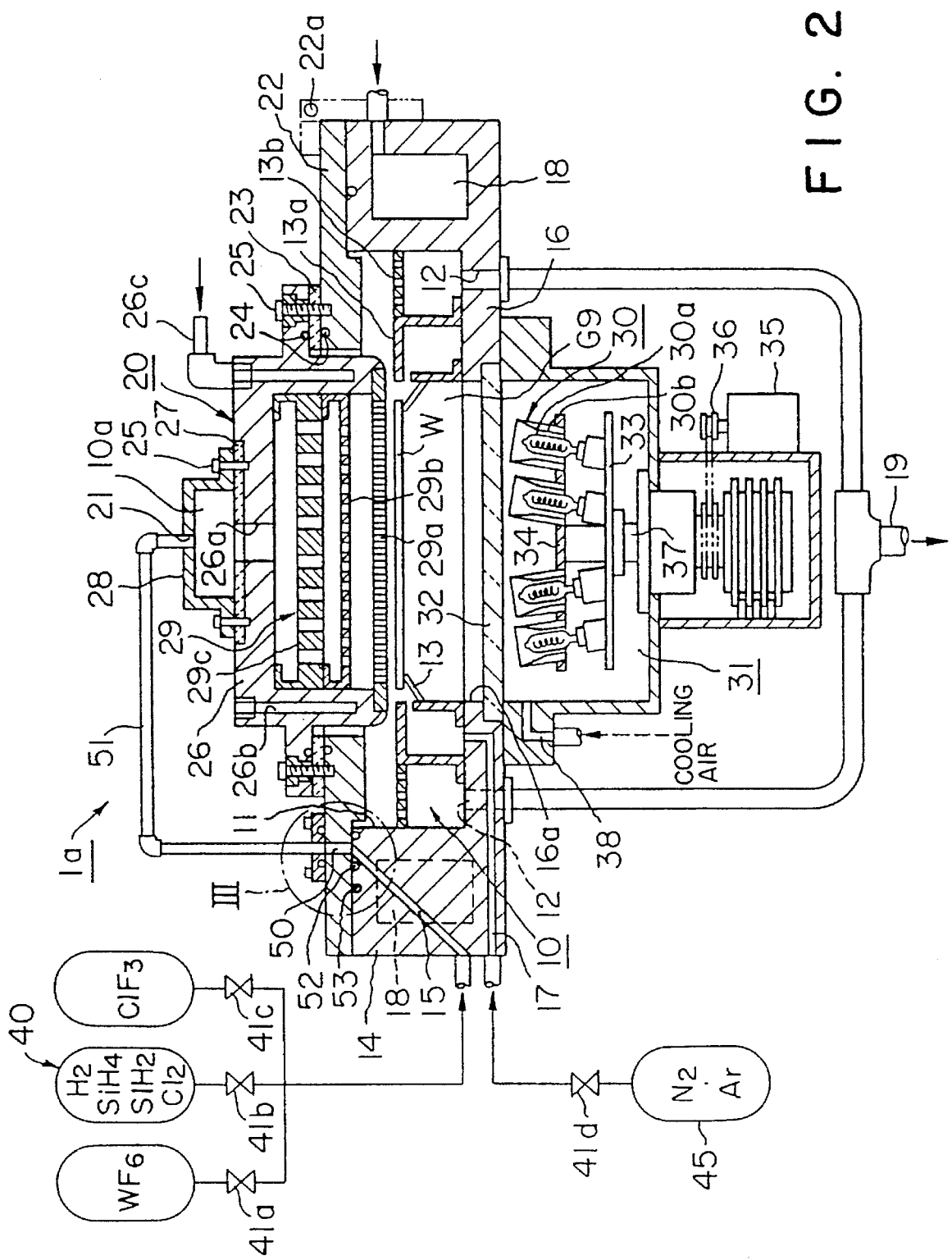
FIG. 2 is a vertical sectional view of the sheet-type film deposition processing device according to a first embodiment of the present invention.

FIG. 2 is a vertical sectional view of the film deposition processing device according to a first embodiment of the present invention.

A major part of the film deposition processing device according to the first embodiment comprises a processing chamber 10 having an opening 11 in the top for receiving at a set position in FIG. 2 a semiconductor wafer W (hereinafter called "wafer") to be processed from the second transfer chamber 9 in FIG. 1 through the gate valve G9, a cap 20 openably connected to an upper part of the processing chamber 10 by means of a hinge 22a for closing the opening 11, a processing gases supply source 40 which is a processing gases supply means for feeding processing gases to the wafer in the processing chamber 10 from the side of the cap 20, and a heating chamber 31 disposed below the processing chamber 10 and having heating means 30 for heating the interior of the processing chamber 10 to a required temperature.

The processing chamber 10 is a box-shaped chamber as shown in FIG. 2 which is made of, e.g., an aluminium alloy. In a side wall 14 of the processing chamber 10 there are provided a plurality (3) of processing gas feed passages 15 which are slantedly extended toward the upper surface thereof. The processing gas feed passages 15 are connected to processing gas supply sources 40 through valves 41a, 41b, 41c. Here in a case that a tugsten film is deposited on the surface of a wafer W, the processing gases are tugsten hexafluoride as a film deposition gas, and hydrogen ($H_2$), monosilane ($SiH_4$) or dichlorsilane ($SiH_2Cl_2$) as a reduction gas. As their carrier gas, $N_2$ or Ar is used. Chlorine trifluoride is used as a purging gas. A purging gas passage 17 is in communication with the interior of the processing chamber 10 through the side wall 14 and the bottom surface. The purging gas passage 17 is connected to a purge gas supply source 45 of an inert gas, such as nitrogen ($N_2$) Or argon or others, through a valve 41d.

A circulation passage 18 for cooling water is formed in the side wall of the processing chamber 10. The circulation passage 18 is connected to a cooling water feed pipe and a discharge pipe not shown. Exhaust ports 12 are formed in the bottom of the processing chamber at four positions thereof. The exhaust ports 12 are connected to an exhaust pipe 19 through a vacuum pump (not shown). The interior of the processing chamber 10 is set at a required vacuum degree (e.g., $10$–$10^{-6}$ Torr) by the operation of the vacuum pump.

Furthermore in the processing chamber 10, a plurality (e.g., 3) of support pins 13 are erected circumferentially at a set interval, and a ring-shaped shield plate 13a for shielding the surrounding of a wafer W supported by the pins 13, and a ring-shaped rectifying plate with a number of small holes provided on the outer periphery of the shield plate 13a. A transmission window 32 of quartz is provided in a bottom window in the bottom 16 of the processing chamber 10. A heating chamber 31 is provided through the transmission window 32.

In the heating chamber 31, a plurality of heating lamps 30 are secured to required parts of two sheets of rotary disks 33, 34 vertical spaced from each other. The heating lamps 30 each include a lamp body 30a, such as tungsten lamp, halogen lamp or others, and a reflecting mirror 30b, so that they irradiate light energy radiation in required directions. The rotary disks 33, 34 are connected to a drive motor 35 by a belt transmission mechanism 36, and are horizontally rotatable on a shaft 37 connected to the rotary disks 33, 34. On a side of the heating chamber 31 there is provided a cooling air introduction port 38 so that cooling air from the cooling air introduction port 38 is introduced into the heating chamber 31 to prevent heating of the interior of the heating chamber and the transmission window 32.

A cap 20 includes a cap base 22 of an aluminium alloy, a processing gas guide portion 26 of an aluminium alloy connected to the cap base 22 by bolts 25 through a ceramic insulating member 27 and a packing 24, and a processing gas feed portion 28 of hat-shaped section connected to the top of the processing gas guide portion 26 through a ceramic insulating member 27. The cap 20 is swung on a hinge 22a to open and close an opening of the processing gas guide portion 26. At a part in the processing gas guide portion 26 opposed to the wafer W there is provided processing gas rectifying/diffusing means 29 including a plurality of steps of aluminium perforated plates with small openings 29a 29b, 29c of a number of different diameters. A processing gas mixing chamber 10a is formed between the processing gas guide portion 26 and the processing gas feed portion 28. The processing gas mixing chamber 10a is in communication with the processing chamber 10 through a passage 26a formed in the top of the guide portion 26. A cooling water circulating passage 26b is formed in the processing gas guide portion 26. The cooling water circulating passage 26b is connected to a cooling water feed pipe 26c and a discharge pipe (not shown).

A processing gas feed port 21 is formed in the processing gas feed portion 28 of the cap 20. In the cap base 22 there are formed a plurality of processing gas passages 50 which are in communication respectively with a plurality of processing gas introduction passages formed in a side wall 14 of the processing chamber 10. The processing gas introduction passages 15 and the processing gas feed port 21 are in communication with each other through a stainless steel connection pipe 51.

Figure 3:
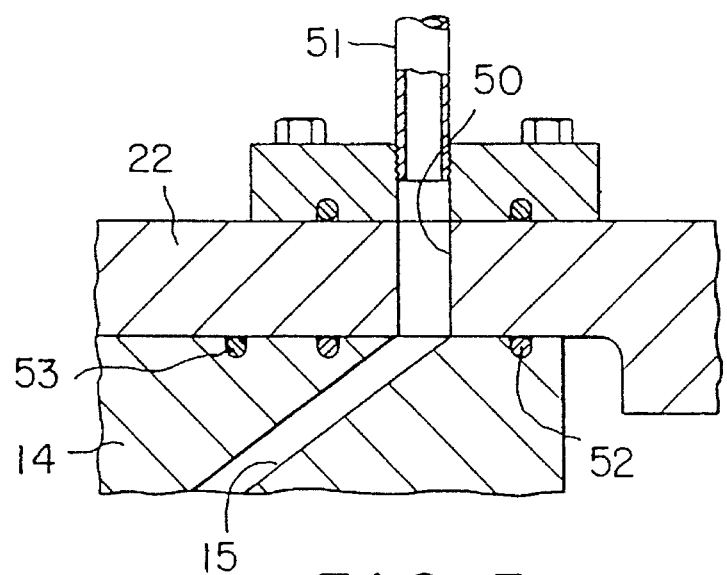
FIG. 3 is an enlarged partial vertical sectional view of the processing gas introduction passages and the processing gas passages of the film deposition processing device of FIG. 2.
Figure 4:
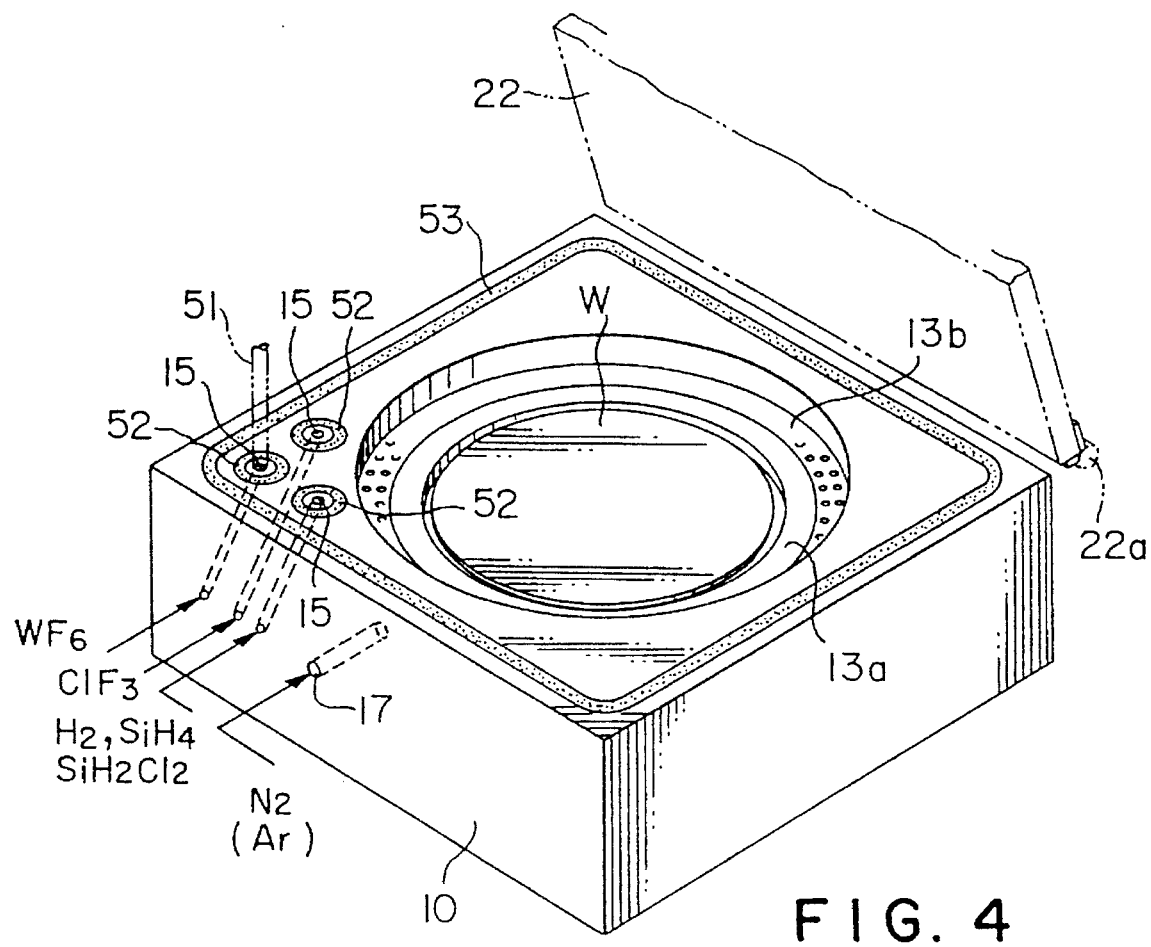
FIG. 4 is a perspective view of a major part of the film deposition processing device of FIG. 2.

As shown in FIGS. 3 and 4, O-rings 52 which are seal members for surrounding the open ends of the processing gas introduction passages 15 opened in the top of the side wall 14 of the processing chamber 10 are provided around the open ends. Outer seal rings 53 as seal members for surrounding the outer peripheries of the O-rings 52 are provided on the top of the side wall 14 outer of the O-rings 52. The O-rings 52 and the outer seal rings 53 are formed of, e.g., perfluororubber ("CURLETZ", Product of Dupont) or fluorinated rubber. Thus, when the opening 11 of the processing chamber 10 is closed by the cap 20, the processing gas introduction passages 15 and the processing gas passages 50 are air-tightly closed, so that processing gases fed from the processing gas feed pipes 15 do not leak outside. If the processing gases should leak outside the O-rings 52, the outer seal rings 53 outside the O-rings 52 could prevent the leakage of the processing gases outside.

In the first embodiment, the O-rings 52 and the outer seal rings 53 are provided on the top of the side wall 14 of the processing chamber 10, but it is not essential. That is, the O-rings 52 are provided around the open ends of the processing gas passages 50 of the cap, i.e., the cap base 22, and the outer O-rings 52 are provided outwardly of the O-rings 52. It is also possible that the O-rings 52 are provided on the top of the side wall 14 of the processing chamber 10, and the outer seal rings 53 are provided on the underside of the cap base 22. The outer seal rings, which are formed in O-rings, are preferably pre-cast in conformity with a configuration (shown in a rectangular shape with arcuate corners) of the grooves for the outer seal rings 53 to be provided in.

Next the operation of the film deposition processing device according to the first embodiment of the present invention will be explained.

In the state of FIG. 2 where the cap 20 is closed with the opening 11 of the processing chamber 10 closed, the gate valve in FIG. 2 is opened, and a wafer W is loaded by the carrier arm 9A into the processing chamber 10 which has been evacuated to a required vacuum atmosphere by the exhaust means and positioned on the support pins 13.

Then the heating lamps 30 are turned on, and light energy radiation from the heating lamps is transmitted through the transmission window 32 to be applied onto the underside of the wafer W. The wafer W is heated for a short period of time (e.g., 30 minutes) from the ordinary temperature to a film deposition processing temperature (e.g., 500° C.). Subsequently after the wafer W reaches a required temperature, $WF_6$ gas as a processing gas for film deposition, and a reduction gas, e.g., $SiH_4$, are introduced from the processing gas source 40 into the respective processing gas introduction passages 15. The $WF_4$ gas and $SiH_4$ gas are fed into the processing gas mixing chamber 10a of the film deposition processing device 1A from the processing gas feed port 21 through the respective processing gas passages 50 of the cap 20, and are mixed therein.

The processing gases mixed in the processing gas mixing chamber 10a are rectified and diffused by the rectifying/diffusing means 29 (three sheets of rectifying plates in FIG. 2) of the processing gas guide portion 26 and are applied evenly onto the upper surface of the wafer W for the film deposition. At this time, a purge gas, e.g., $N_2$ gas or others, is fed into the processing chamber 10 from a purge gas feed passage 17 to prohibit deposition of tungsten films of a component of the processing gas on the peripheral edges and underside of the wafer W.

After the film deposition is thus conducted for a set period of time, the feed of the processing gas is stopped, and the heating lamps 30 are turned off. Then the processing gas in the processing chamber 10 is exhausted from the exhaust port 12 by exhaust means outside the device. Then the gate valve G9 is opened, and the film deposition processed wafer W is unloaded by the carrier arm 9A outside the film deposition device 1a.

After the film deposition processed wafer W is unloaded from the processing chamber 10, in a case where the interior of the processing chamber 10, and the processing gas rectifying/diffusing means 29 are purged, a purging processing gas, i.e., $ClF_3$, from its supply source 40 is fed from the processing gas feed port 21 into the processing chamber 10 through its processing gas introduction passage 15, its processing gas passage and the connection pipe 51. Components of the $ClF_4$ gas react with components of the processing gas staying on the insides of the rectifying/diffusing means 29 and the processing chamber 10 to remove the staying components of the processing gas and exhaust the same from the exhaust port 12 by the exhaust means.

In a case where the device is repaired or inspected after the above-described operation is repeated to film deposition process wafer W one after another, the cap 20 is swung on the hinge 22a to its opening side to open the opening 11 of the processing chamber 10 to permit the interior of the processing chamber 10, and members, such as the support pins 13, the transmission window 32, etc. to be repaired and inspected. At this time, the connection pipe 52 interconnecting the processing gas feed port 21 and the processing gas passages 50 is moved together with the cap 20. Accordingly it is not found in the device of the present invention that, as in the conventional device, the flexible tube is bent and deformed every time the cap 20 is swung, with the result that processing gases stay 20 on the inside of the connection pipe 51 and cause particles.

After the device is repaired or inspected, the cap 20 is swung in its closing direction and closes the opening 11, the processing gas passages 50 in the cap 20, and the processing gas introduction passages 15 in the processing chamber 10 are brought into communication with each other. Further the interface between the cap 20 and the side wall 14 is sealed by the O-rings 52. Accordingly the processing gas can be fed without leakage to the outside. If the processing gas should leak from the O-rings 52, the outer seal rings 53 on the outer periphery of the O-rings 52 can prevent the leakage to the outside.

[Second Embodiment]

Figure 5:
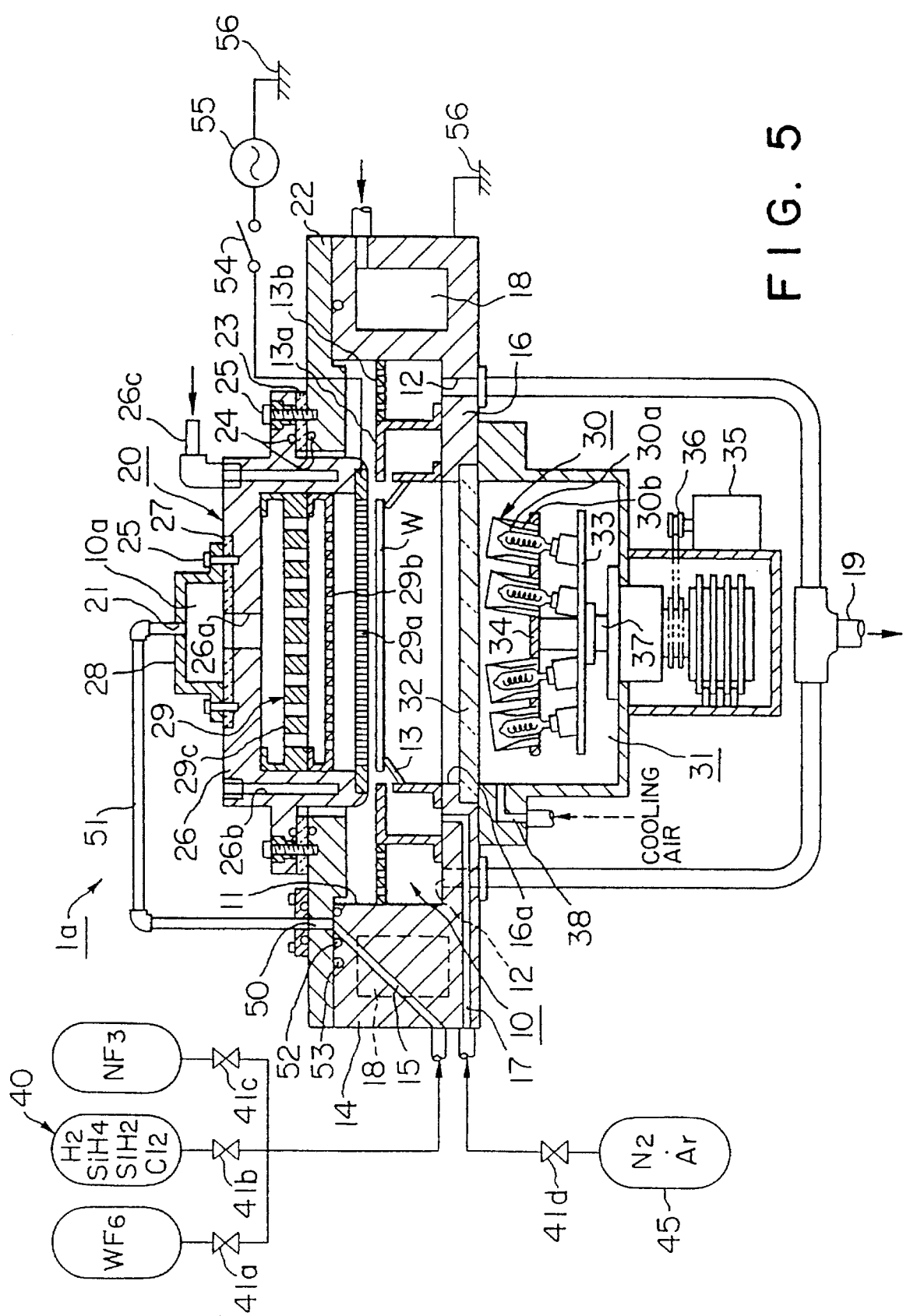
FIG. 5 is a vertical sectional view of the film deposition processing device according to a second embodiment of the present invention.
Figure 6:
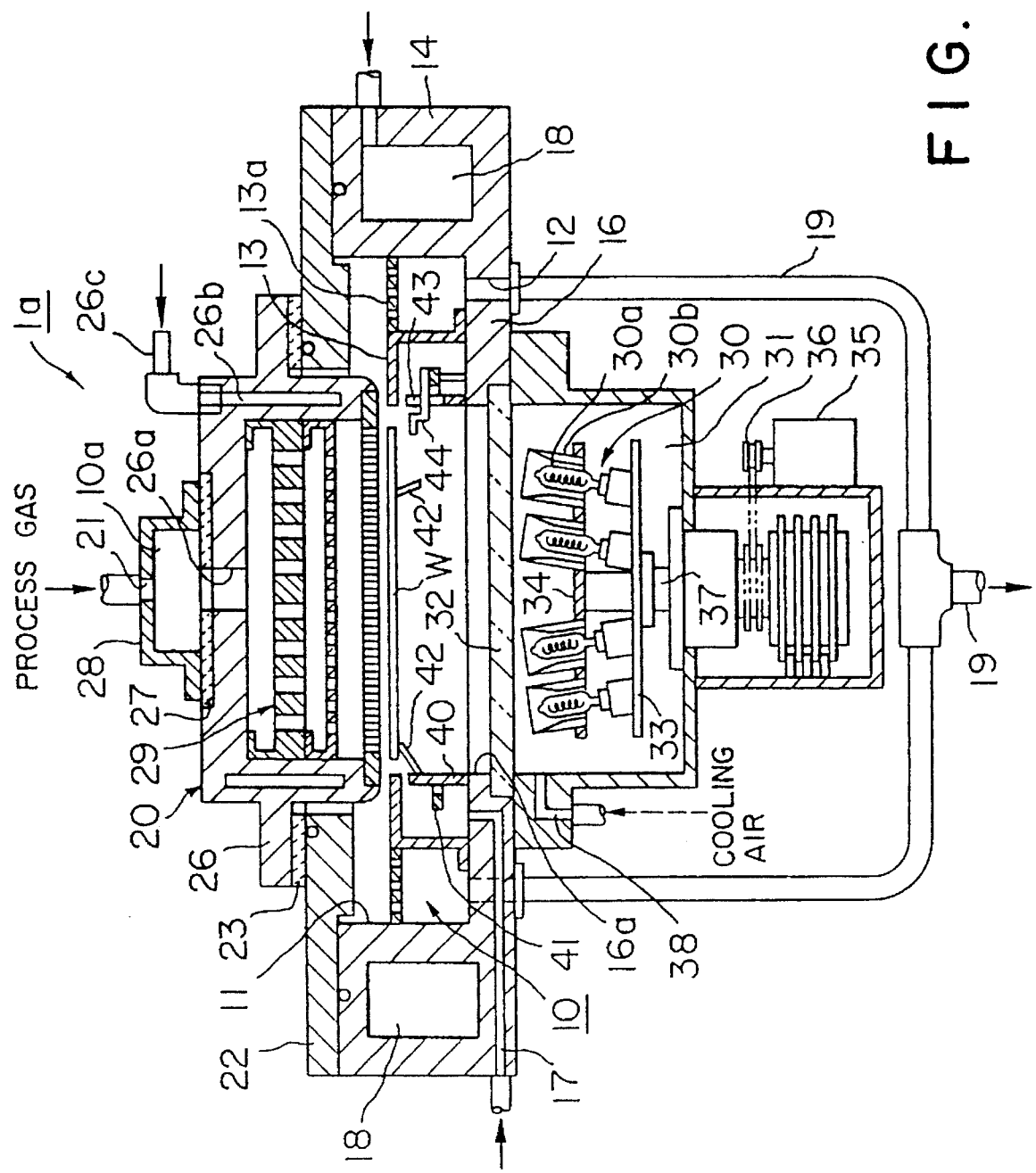
FIG. 6 is a vertical sectional view of the film deposition processing device according to a third embodiment of the present invention.

FIG. 5 is a vertical sectional view of the sheet-type film deposition processing device according to a second embodiment of the present invention.

In the second embodiment, a cap 20 includes, as in the first embodiment, a cap base 22 of an aluminium alloy, a processing gas guide portion 26 of an aluminium alloy connected to the cap base 22 by bolts 25 through a ceramic insulating member 23 and a packing 24, and a processing gas feed portion 28 of hat-shaped section connected to the top of the processing gas guide portion 26 by bolts 25 through a ceramic insulating member 27.

Rectifying/diffusing means 29 disposed in the cap 20 of the above-described structure has a rectifying/diffusing plate 29a nearest to a wafer W connected to a high-frequency electric power source 55, and the processing chamber 10 is grounded by earth 56, so that plasmas are generated between the lowermost rectifying/diffusing plate 29a and the processing chamber 10.

As that of processing gases for purging, nitride trifluoride ($CF_3$) are used, and a $NF_3$ gas source is connected, through a valve 41c, to processing gas introduction passages 15 formed in the processing chamber 10.

The second embodiment is the same as the first embodiment in the other respects, and common members have common reference numerals not to repeat their explanation.

In the second embodiment of the above-described structure, in a case where the interior of the processing chamber is purged after film deposition processing is over on a wafer W, and the wafer W has been unloaded out of the processing chamber as in the first embodiment, the following processing is conducted. That is, a switch 54 is turned on to apply a high-frequency voltage between a rectifying/diffusing plate 29a of the rectifying/diffusing means 29 and the processing chamber 10 to thereby generate plasmas, while $NF_3$ gas as the purging processing gas is fed into the processing chamber 10 from a processing gas feed port 21 through a processing gas introduction passage 15, a processing gas passage 50 and a connection pipe 51. Then components of the $NF_3$ gas are ionized or radicalized by the plasmas, whereby reaction components of the processing gases staying on the interior of the rectifying/diffusing means 29 (rectifying/diffusing plate 29a) can be removed.

It is also possible to ionize and radicalize film deposition processing gases to be used in film deposition on a wafer W. In such case, $SiH_4$, for example can used as a film deposition processing gas, and Ar, for example can used as a carrier gas.

In the first and the second embodiments, objects to be processed are semiconductor wafers, but it is not essential. The device according to the present invention is applicable, in addition to semiconductor wafers, to glass substrates, etc. in fabrication processes of liquid crystal substrates. In the above-described embodiments, the film deposition processing device according to the present invention is applied to CVD devices, but the present invention is not limited to them and is applicable to, e.g., sputtering devices.

[Third Embodiment]

Figure 7:
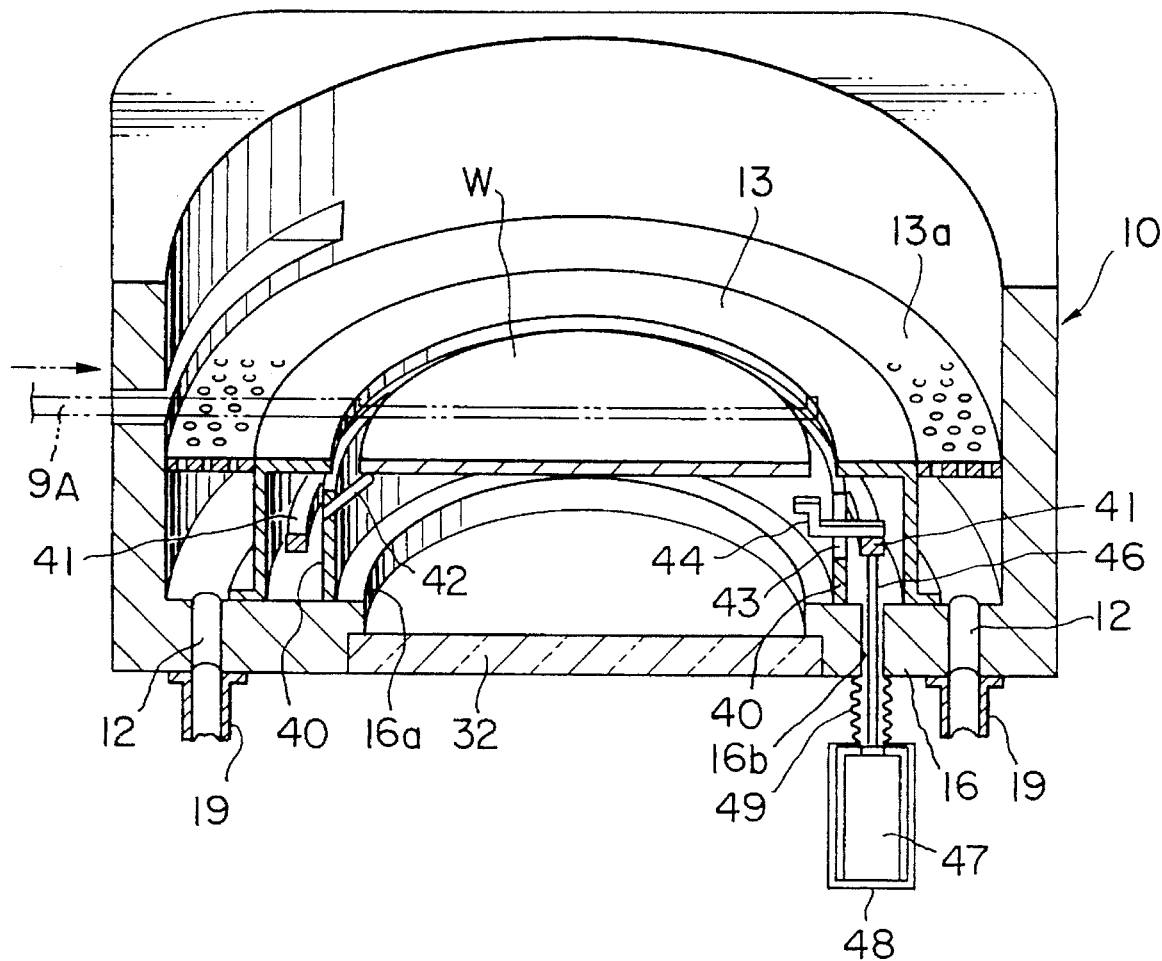
FIG. 7 is a perspective sectional view of a major part of the film deposition processing device of FIG. 6.
Figure 8:
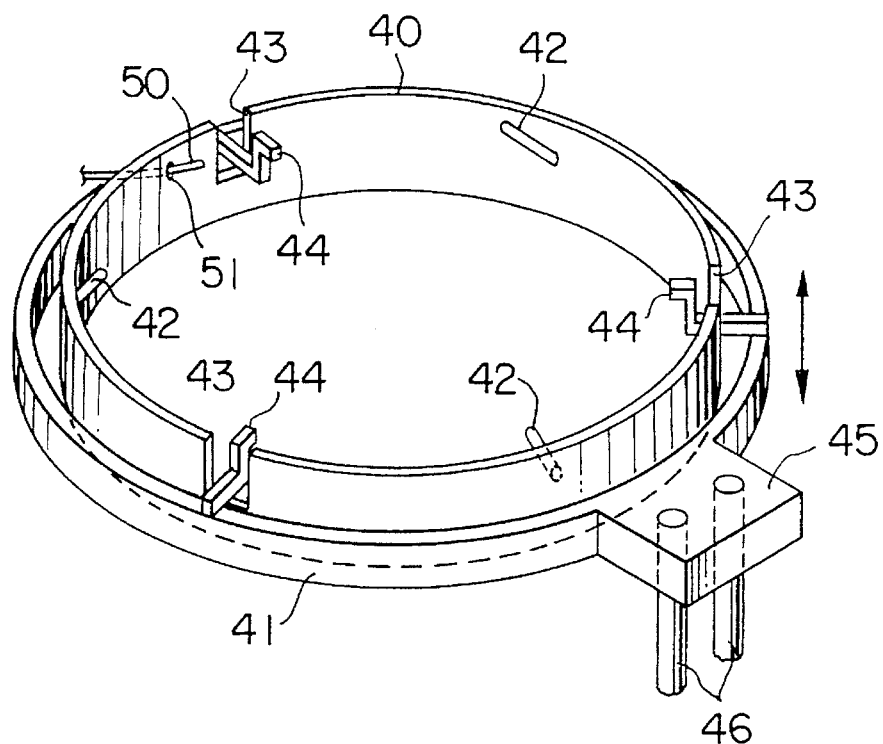
FIG. 8 is a perspective view of the film deposition processing device of FIG. 6 explaining an arrangement of the support pins and the transfer pins for a wafer.

As shown in FIGS. 6 to 9, the film deposition processing device according to a third embodiment of the present invention includes in a processing chamber 10 a ring-shaped support 40, and a vertically movable ring 41 disposed on the outer periphery of the ring-shaped support 40. As shown in FIG. 8, the ring-shaped support 40 has three support pins 42 erected from the inner periphery circumferentially spaced from each other by 120°, and upward opened slits 43 formed in the ring-shaped support 40 at three positions between each support pin 42 and its adjacent one.

The movable ring 41 has three crank-shaped transfer pins 44 mounted thereon at a 120° circumferential interval. The respective transfer pins 44 are jutted vertically movable through the slits 43 in the ring-shaped support 40. A bracket portion 45 is projected from a part of the movable ring 41. Two rods 46 provided on the underside of the bracket portion 45 are passed through through-holes 16a formed in the bottom 16 of the processing chamber 10 and connected to a guide which is vertically slidable by a motor disposed outside. A stepping motor 47 in FIG. 7 is operated to vertically move the movable ring 41 to thereby vertically move the transfer pins 44 inside the ring-shaped support 40. Exposed portions of the rods 46 between the bracket portion 45 and the guide 48 accommodating the stepping motor 47 are covered by a bellows seal 49 to shut off the outside air.

The support pins 42 having the above-described structure are transparent quartz members, e.g., 4 mm-square rods or round rods, or 1–2 mm square rods or round rods. The support pins 42 and the transfer pins 44 are thus formed of a transparent material, such as quartz, whereby when light energy radiation is applied to the wafer W from heating means 30, little shade is formed, with the result that there is no little affect by the shade. In addition, quartz does not easily accumulate heat, the light energy radiation is not absorbed by the quartz, with the result that the wafer is little affected. In the third embodiment, the support pins 42 and the transfer pins 44 are three, but are not necessarily three. As long as the support pins 42 and the transfer pins 44 are provided at a set circumferential interval and in such a manner as to intersect each other, they may be provided in an arbitray number more than three.

Figure 9:
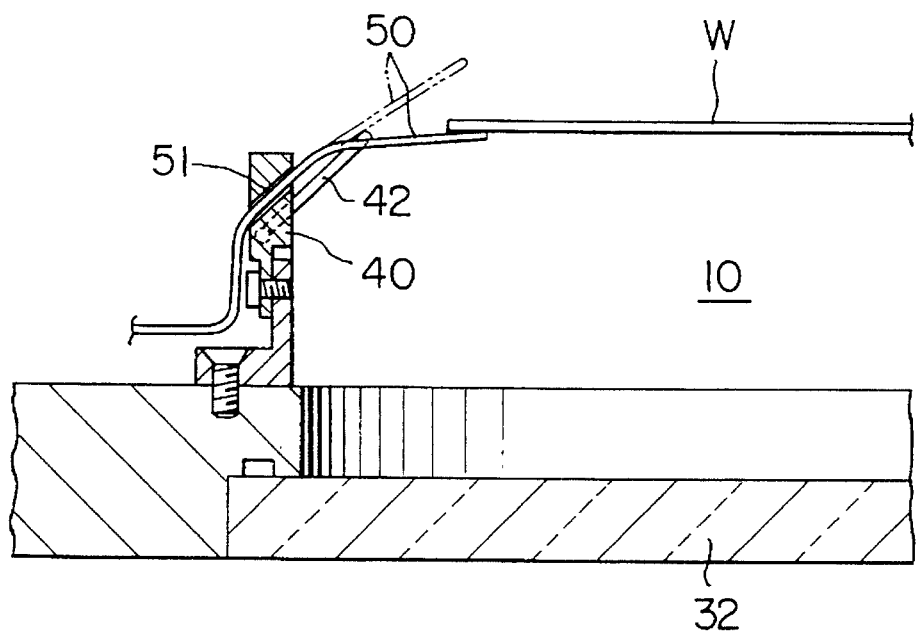
FIG. 9 is an enlarged partial vertical sectional view of the thermocouple provided in the ring-shaped support of the film deposition processing device of FIG. 6, which is explanatory of the manner of the provision of the thermocouple.

As shown in FIGS. 8 and 9, a guide hole 51 inclined toward the inside of the ring-shaped support 40 is formed in a part thereof, and a thermocouple 50 is projected through the guide holes 51 inside the ring-shaped support 40. The thermocouple 50 is projected upwardly inward, so that the thermocouple 50 can be pressed, without failure, against the underside of the processed surface of the wafer W supported by the support pins 42, which enables a temperature of the wafer W being processed to be correctly measured.

Then the operation of the film deposition processing device according to the third embodiment will be explained.

Figure 10A:
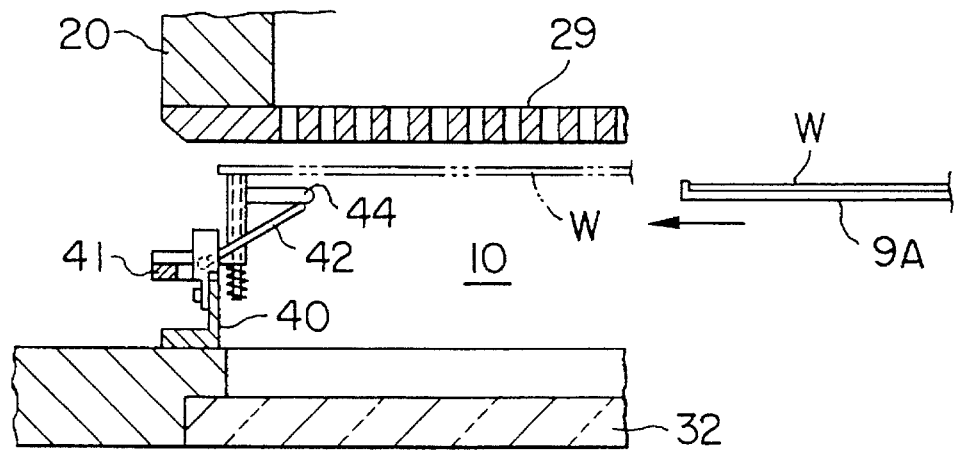
FIGS. 10A to 10C show the operation of the support pins and the transfer pins of the film deposition processing device of FIG. 6.
Figure 10B:
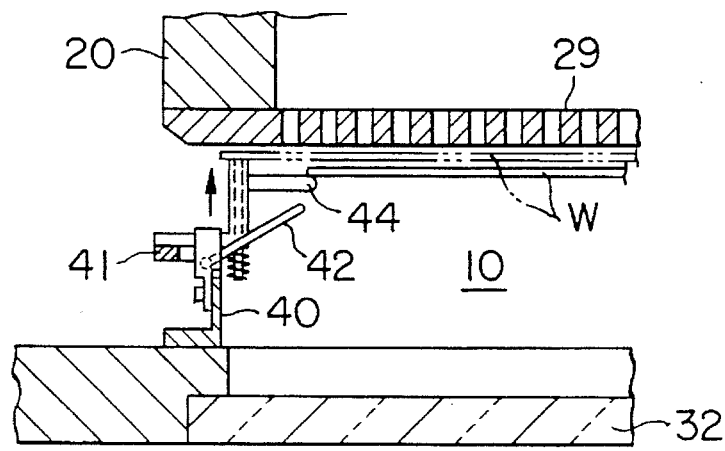
Figure 10C:
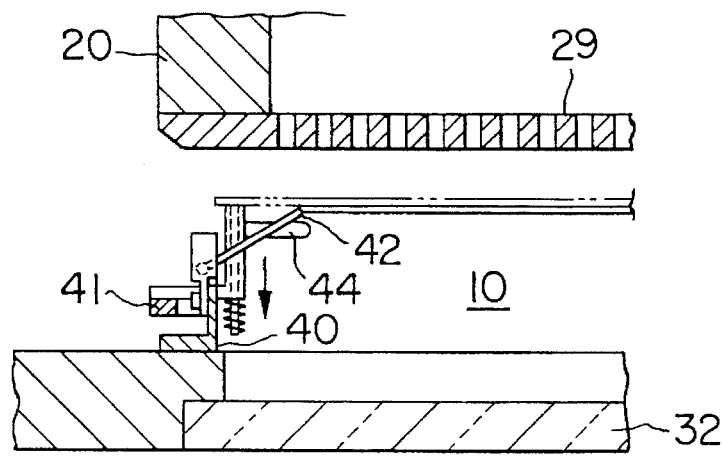

As in the first and the second embodiments, a gate valve G9 is opened in the state where the cap 20 is closed with the opening 11 of the processing chamber 10 closed, and as shown in FIG. 10A, a wafer W is carried by the transfer arm 9A into the processing chamber 10 which has a pressure beforehand decreased to a vacuum atmosphere by the exhaust means. Then the transfer pins 44 are raised to receive the wafer W on the carrier arm 9A, and the carrier arm 9A is retreated outside the processing chamber 10 (FIG. 10B). In this state, the transfer pins 44 are lowered to deliver the wafer W on the transfer pins 44 to the support pins 42 (FIG. 10C).

Then light energy radiation is applied from the heating lamps 30 through the transmission window 32 to the underside of the wafer W mounted on the support pins 42. The transfer pins 44 and the support pins 42 transmit the light beams onto the wafer W, so that the underside of the wafer W can be homogeneously heated. Accordingly the wafer W is heated for a short period of time (e.g., about 30 seconds) from the ordinary temperature to a film deposition processing temperature (e.g., 500° C.).

Then the same process as in the first and the second embodiments will follow.

[Fourth Embodiment]

The film deposition processing device according to a fourth embodiment of the present invention will be explained with reference to FIGS. 11 to 16. Only differences of the fourth embodiment from the above-described embodiments will be explained.

A major part of the film deposition processing device according to the fourth embodiment comprises a processing chamber 10 for accommodating a semiconductor wafer W to be processed at a set position and having an opening 11 in the top 11, a cap 20 for opening and closing the opening 11 which is provided swingably by a hinge (not shown) on the top thereof, and a heating chamber 31 including heating means 30 disposed below the processing chamber 10 for heating the underside of wafer W loaded in the processing chamber.

Figure 11:
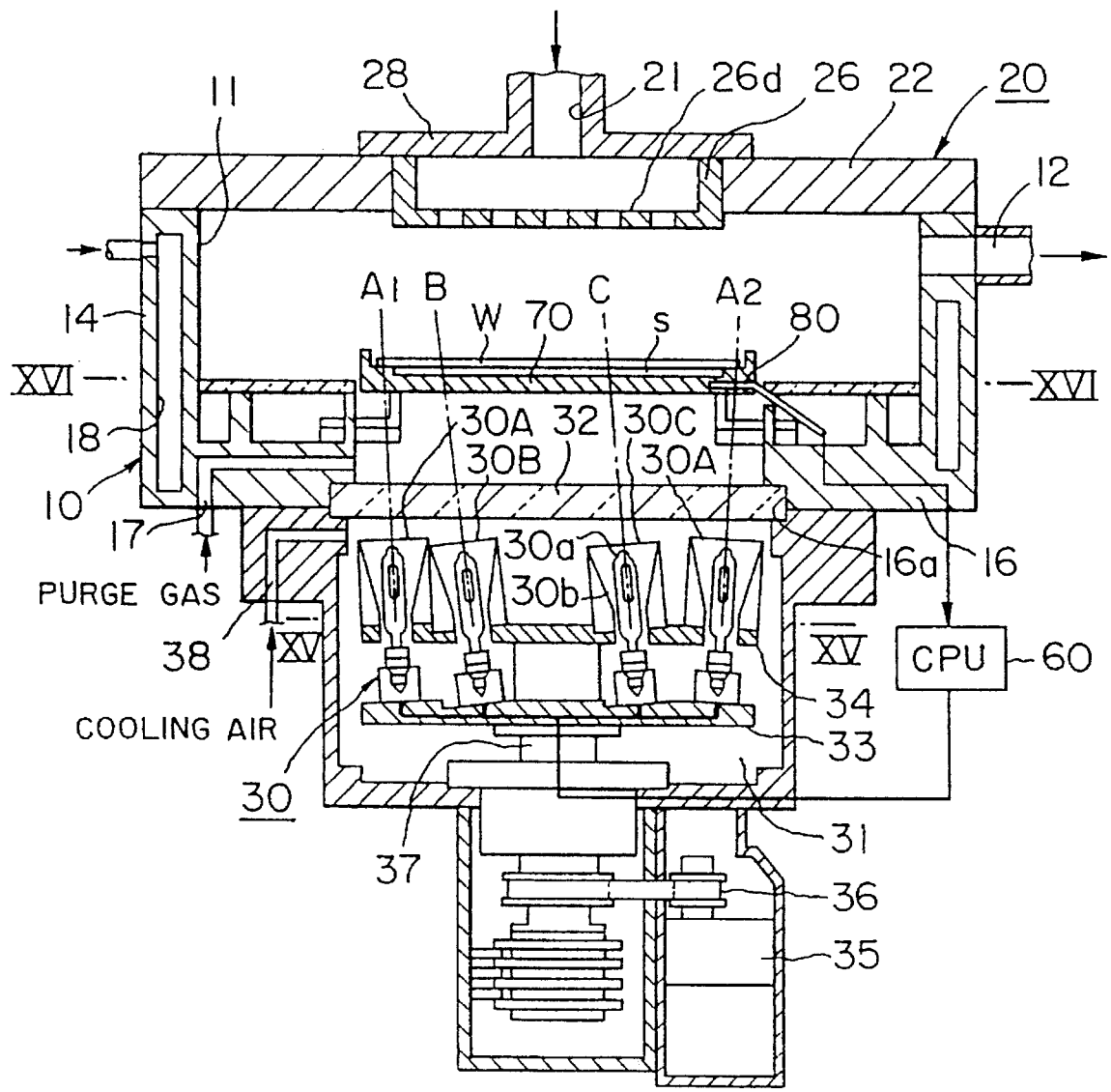
FIG. 11 is a vertical sectional view of the film deposition device according to a fourth embodiment of the present invention.
Figure 12:
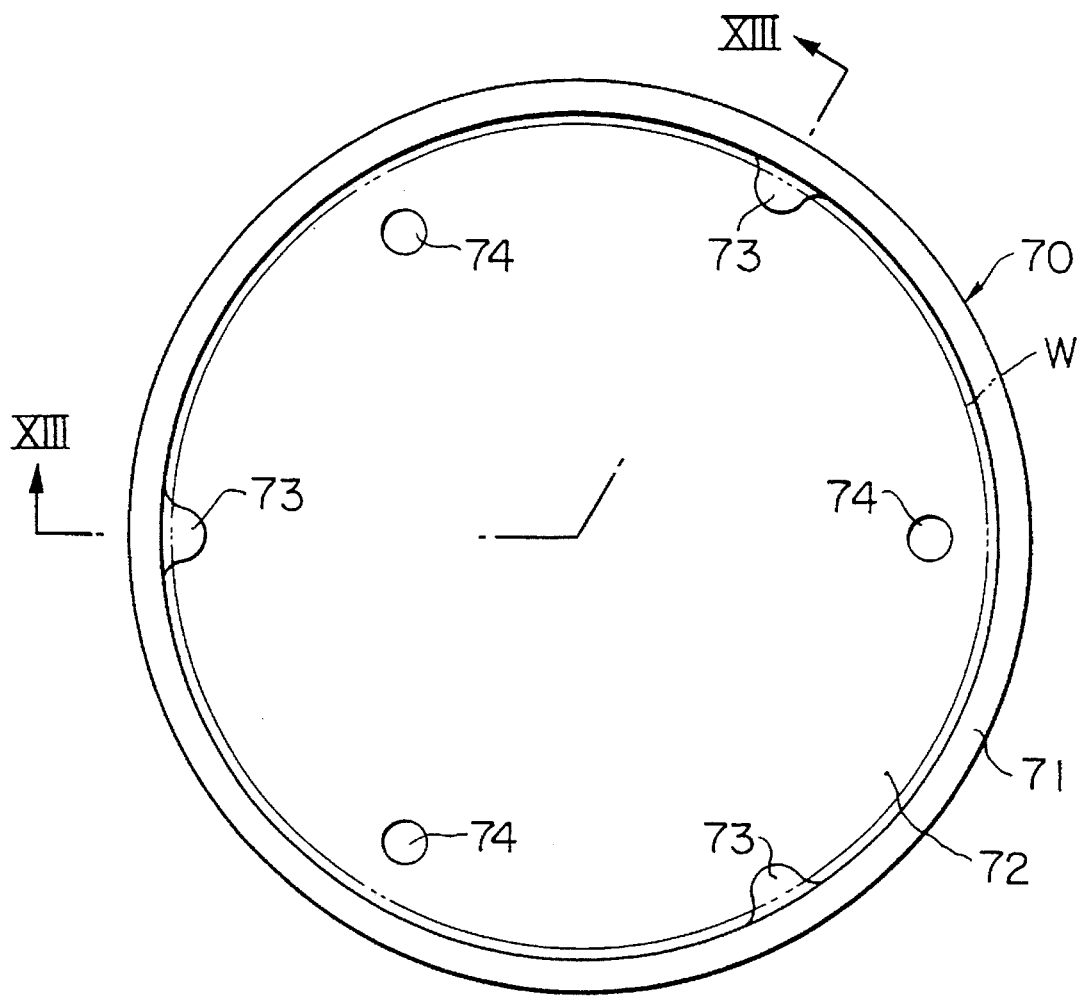
FIG. 12 is a plan view of one example of the wafer holding means included in the film deposition processing device of FIG. 11.
Figure 13:
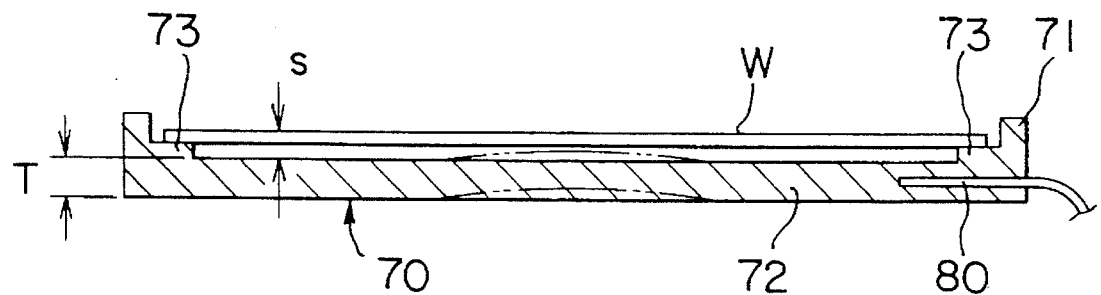
FIG. 13 is a sectional view of the film deposition processing device along the line XIII—XIII in FIG. 11.

As shown in FIG. 11, the processing chamber 10 accommodates a susceptor 70 which is a holding means for holding a wafer W in position. As shown in FIGS. 12 and 13, the susceptor 70 comprises a disc-shaped thin substrate 72 having an erected wall 71 on the periphery, and three holding portions 73 which are erected on the side of the front surface of the substrate 72 and projected from the inside of the erected wall 71 at a set interval. A thermocouple 80 as a temperature detecting means is buried in the substrate 72 of the susceptor 70.

The susceptor 70 of the above-described structure is formed of a carbon-based material of a small heat capacity, such as amorphous carbon, graphite or others and is generally black for high light energy absorption. A thickness T of the substrate 72 is set at about 1 mm, and a height of the holding portions 73, i.e., a gap S between the underside of the wafer W and the surface of the substrate is set at about 0.4 mm. In the fourth embodiment the holding portions 73 are provided at circumferentially trisected positions, but a number of the holding portions 73 are not necessarily three. As long as the holding portions 73 are three or more, they may be provided at four or more positions or all around the circumference.

A transmission window of quartz is provided in a lower opening 16a in the bottom 16 of the processing chamber 10, and a heating chamber 31 is provided through the transmission window 32. In the heating chamber 31, a plurality of heating lamps 31 as heating means are secured to two vertically spaced rotary discs 33, 34 at set positions. Each heating lamp 30 comprises a lamp body, such as tungsten lamp, halogen lamp or others, and two reflecting mirror 30b, whereby as will be explained later, light energy radiation is applied in set directions (A, B, C).

Figure 14:
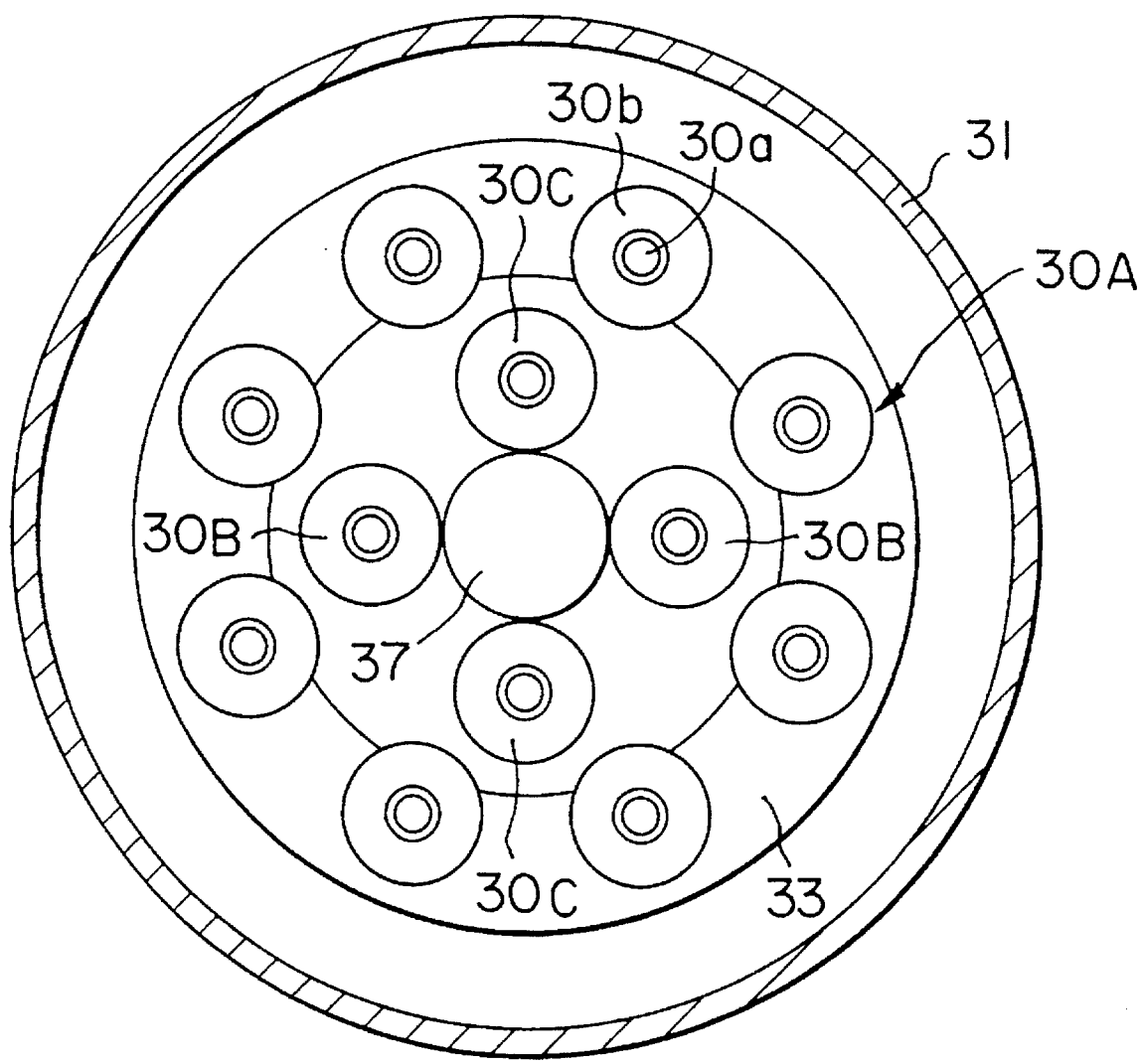
FIG. 14 is a plan view of the heating lamp groups included in the film deposition processing device of FIG. 11.
Figure 15:
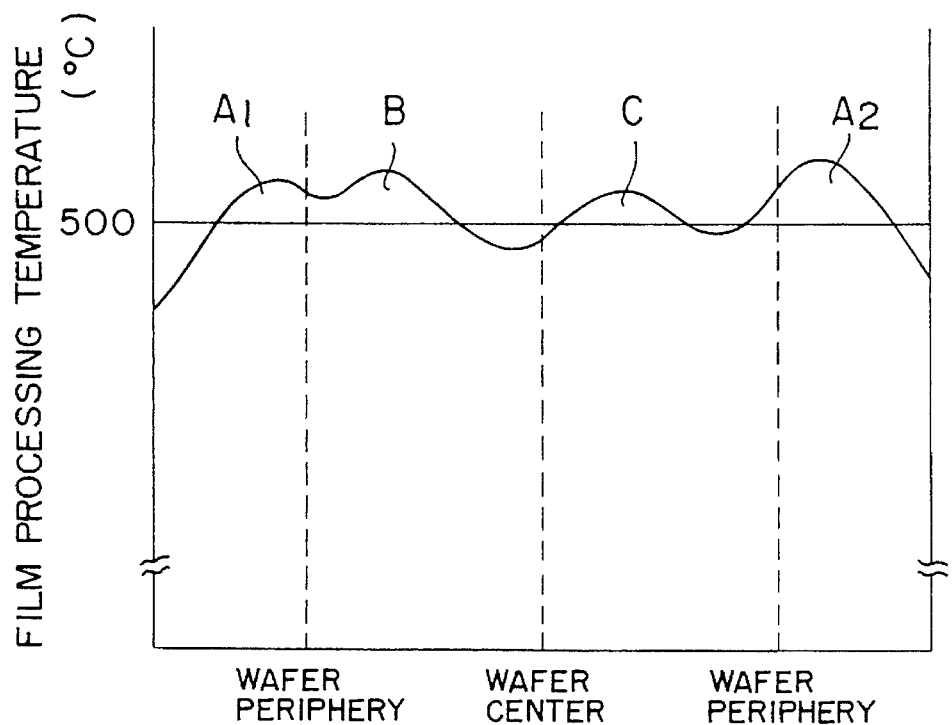
FIG. 15 is a graph of a temperature distribution of the film deposition processing device along the line XV—XV in FIG. 11.

As shown in FIG. 14,, the heating lamps 30 include two sets of 8 outer circumferentially arranged heating lamps 30A and of 4 inner circumferentially arranged heating lamps 30C, 30B. The heating lamps 30 are not necessarily arranged along such double circumferences but may be arranged along a single circumference. A number and an arrangement of the heating lamps are not limited to the above.

In the heating lamps 30 having the above-described arrangement, optical axes of the heating lamps 30A–30C, and light energy radiation reflecting directions of the reflecting mirrors 30b can be adjusted by turning the rotary disc 33 so that the heating lamps 30 define 3 irradiation paths or irradiation regions A1, B, C, A2 in the section along the line XV—XV in FIG. 11, whereby the respective irradiation regions can have adjusted irradiation outputs.

That is, in the example of FIG. 11, the 8 heating lamps 30A along the outer circumference are tilted in the directions A1, A2. As a result, in FIG. 15 or 16, one irradiation region represented by the path or the temperature distribution indicated by A1 (A2) is formed. The heating lamps 30B, 30C along the outer circumference are tilted in different directions from each other, i.e., the heating lamps 30B are paired in 2 sets with the heating lamps 30C (specifically the heating lamps 30C are tilted outward, and the heating lamps 30C are tilted toward the rotation axis). As a result, in FIGS. 15 and 16, two light energy irradiation regions represented by the paths, or the temperature distributions B (of the heating lamps 30B) or C (of the heating lamps 30C) are formed.

Figure 16:
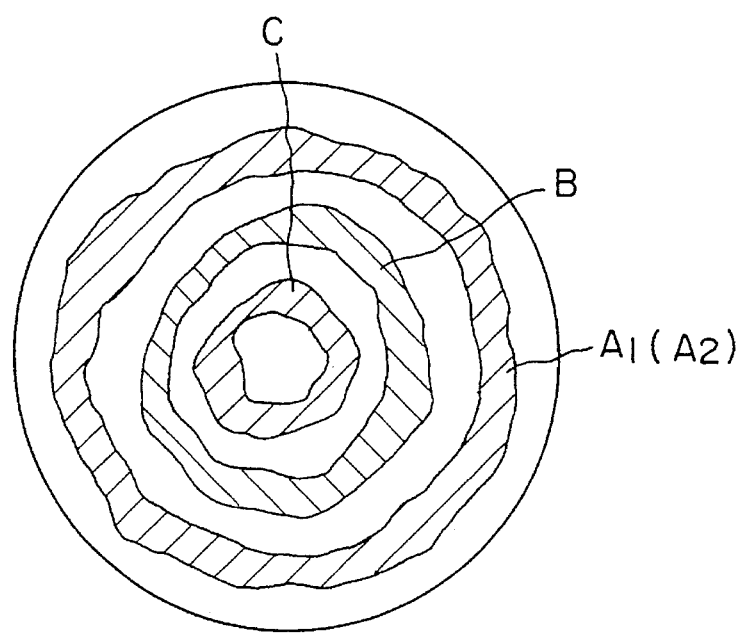
FIG. 16 is an explanatory view of irradiation regions of the film deposition processing device along the line XVI—XVI in FIG. 11.

By the heating lamps 30 having the above-described arrangement the rotary disc 33 is turned to form intended sets of the heating lamps, whereby three substantially conical irradiation regions of FIG. 16 are formed as measured in, e.g., the XV—XV section in FIG. 11, so that the irradiation output can be adjusted by the unit of the irradiation regions. In the shown example, the heating lamps are grouped so as to form three irradiation regions. But according to the present invention, the above-described arrangement is not essential, and the heating lamps may be arranged so as to form less or more irradiation regions.

Figure 17:
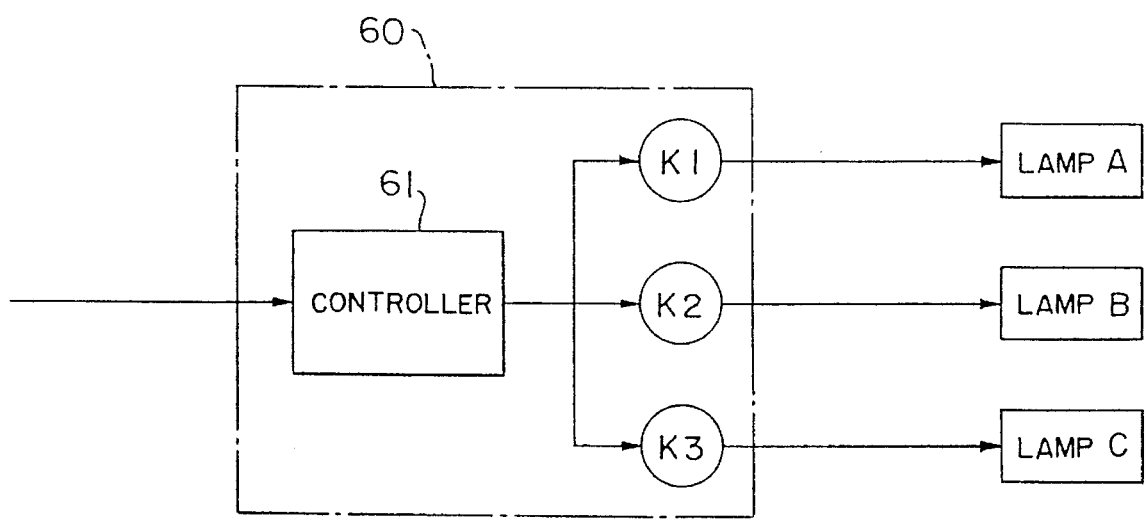
FIG. 17 is a block diagram of temperature control of the heating means included in the film deposition processing device of FIG. 11.

The thermocouple 80 buried in the susceptor 70 as shown in FIG. 11 has a resolving power set at, e.g., 1° C. A detection signal (output voltage) of the thermocouple 80 is supplied to a CPU (central processing unit) as control means (specifically, to controller 61 by suitable bus means as in FIG. 17) to be used for temperature control of the heating lamps 30. That is, a plurality of patterns of power ratios of irradiation outputs between irradiation regions which can consequently heat a wafer W uniformly have been given on sample wafers corresponding to peripheral processing conditions, kinds of objects to be processed and processing steps, and have been stored by the CPU memory 60 (not shown). As shown in FIG. 17, the pre-set patterns of power ratios, and output signals of the controller for controlling powers for the respective irradiation regions are related by a set of selected coefficients (K1, K2, K3) for the respective irradiation regions. Thus according to the fourth embodiment using a single thermocouple 80, the heating lamps 30 irradiate simply based on an output of the CPU 60 in accordance with a set of selected coefficients, whereby heating of objects to be processed can be controlled in accordance with processing steps, kinds of the objects, and processing atmospheres.

Figure 18:
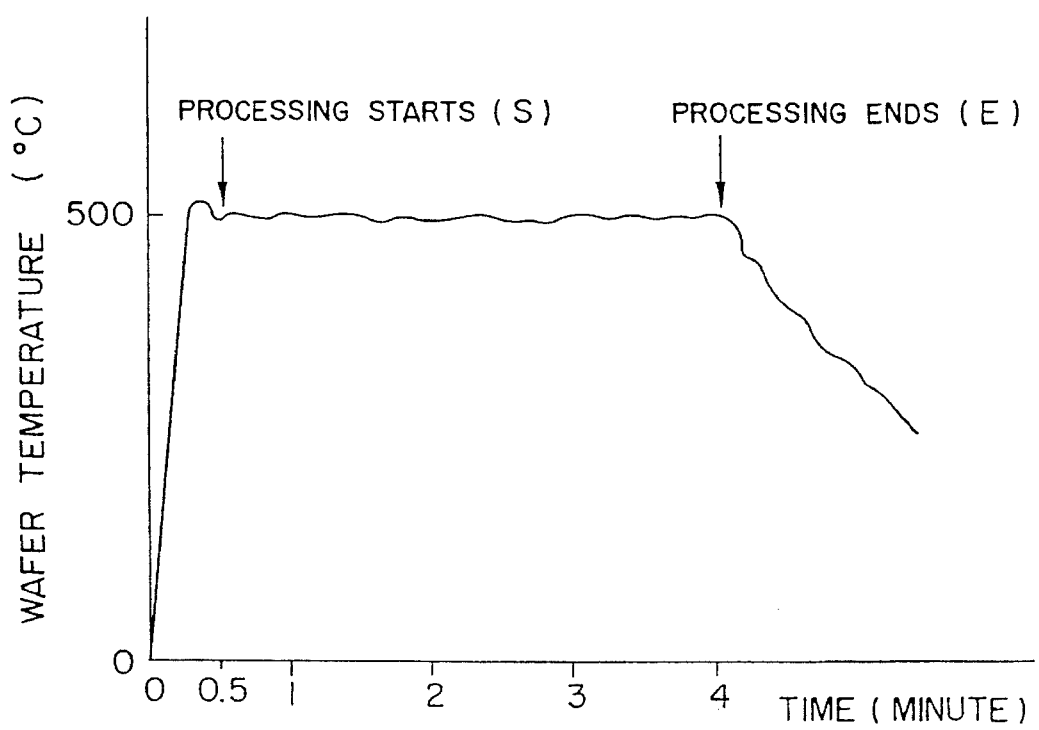
FIG. 18 is a graph of transient changes of temperatures of treated objects (wafers) in the film deposition processing by the film deposition processing device of FIG. 11.
Figure 19:
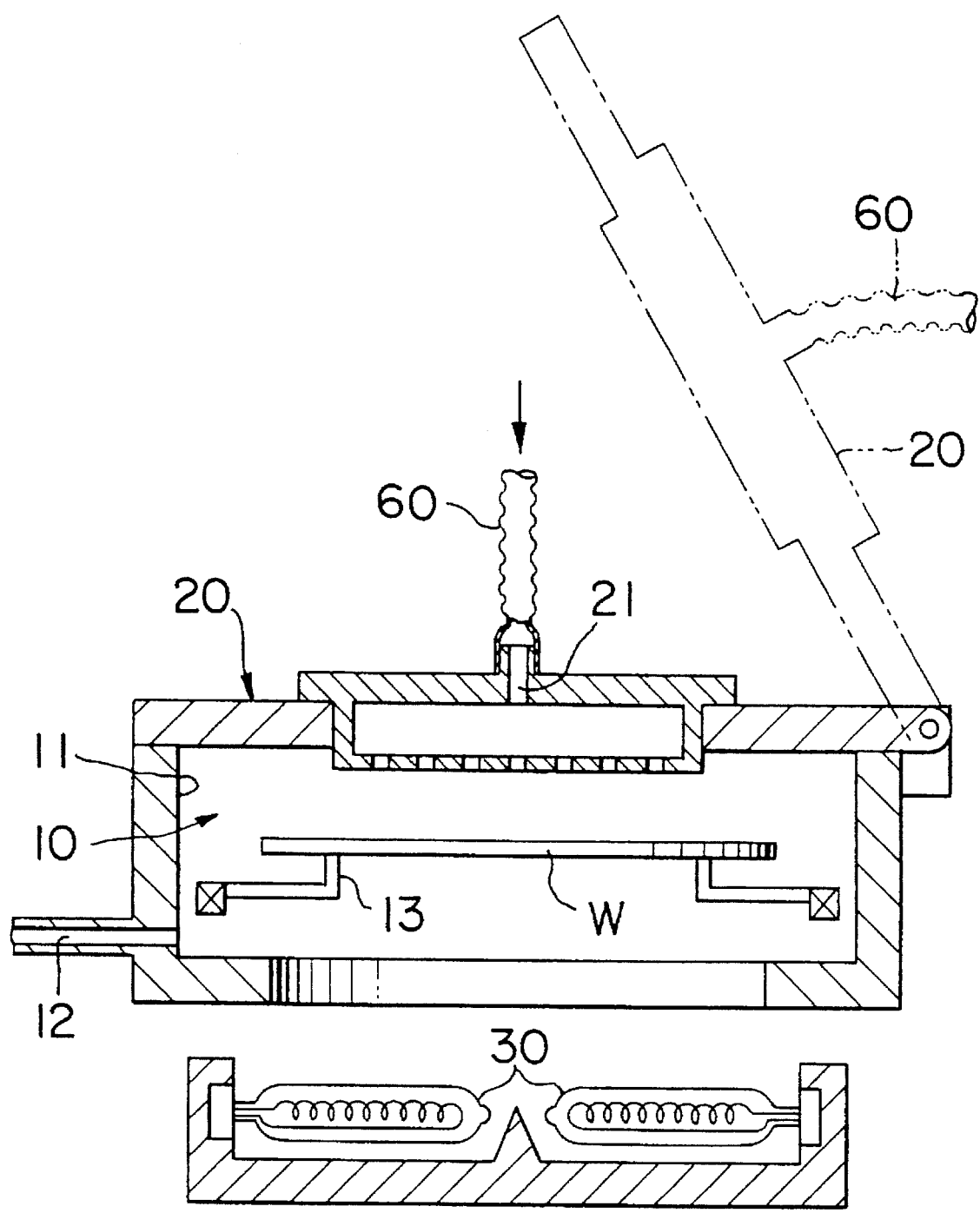
FIG. 19 is a vertical sectional view of the first conventional sheet-type film deposition processing device.
Figure 20:
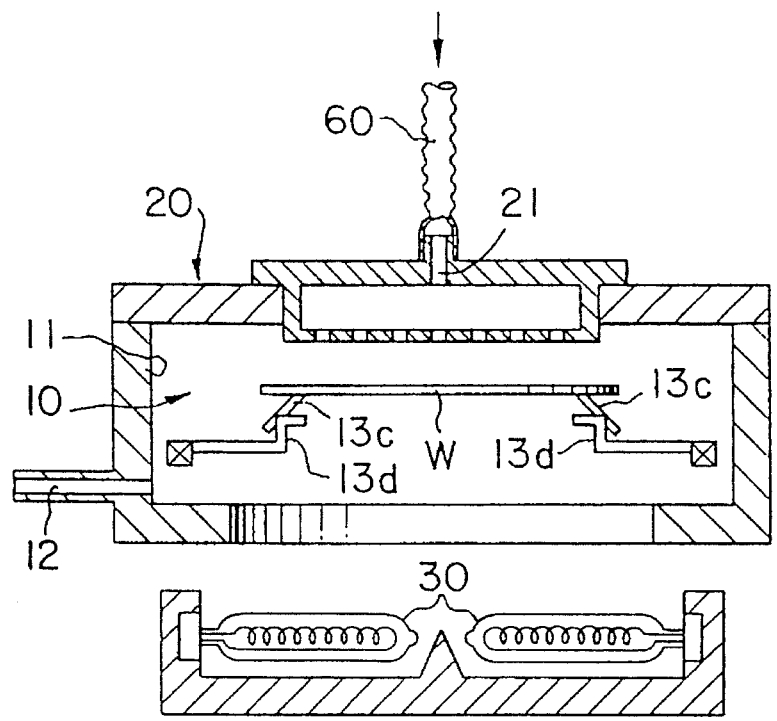
FIG. 20 is a vertical sectional view of the second conventional sheet-type film deposition processing device.
Figure 21:
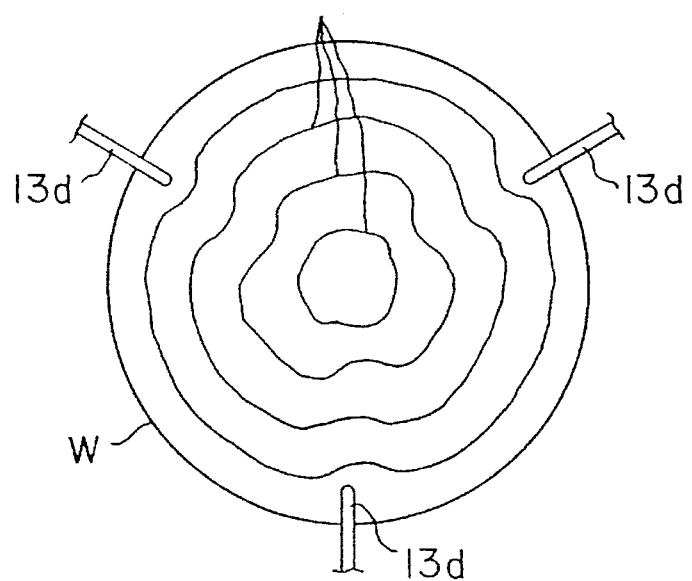
FIG. 21 is an explanatory view of a temperature distribution of treated objects (wafers) processed by the conventional film deposition processing device of FIG. 20.

As exemplified in FIG. 18, in a preparatory processing step(O-S), preferably a wafer W, an object to be processed is quickly heated up to a required film deposition temperature while overshooting is minimized. In contrast to this, in the film deposition processing step (S-E), temperature control is necessary to retain the wafer W homogeneously at the temperature with high precision. Thus one processing includes different controls, and besides, in some cases, processing atmospheres largely vary (e.g., presence and absence of processing gases, and pressure differences). In such cases, although an output of the thermocouple 80 is the same, different temperature precisions are necessary. The conventional control method cannot achieve the temperature control with high precision.

But according to the present invention, a set of coefficients (K1, K2, K3) is suitably changed corresponding to processing steps in such different conditions, whereby the temperature control can be optimized corresponding to processing steps, kinds of objects to be processed, and processing atmospheres, based on one and the same output of the thermocouple 80.

As exemplified in FIG. 18, in the case that 500° C. is an optimum film deposition condition, according to the present invention, for example, an outer irradiation region (a) has a higher irradiation power ratio than inner irradiation regions (B, C) in the preparatory heating mode (O-S), whereby quick heating with little overshooting can be attained. In contrast to this, in the film deposition heating mode (S-E), for example, the outer irradiation region (A) has a smaller power ratio than the outer irradiation regions (B, C), whereby a uniform temperature can be retained with high precision.

In controlling the heating lamps 30, as described above, a temperature detection signal of the susceptor 70 detected by the thermocouple 80 is inputted to the controller 61 of the CPU 60, the temperature information and a pre-stored pattern of irradiation power ratios for respective sets of the heating lamps are compared with each other, and an output signal of the controller 61 is supplied to the heating lamps 30. Consequently film deposition processing on wafers W can be carried out in optimum processing temperatures.

What is claimed is:

1. A film deposition processing device comprising:

a processing chamber for accommodating an object to be processed at a position;

a ring-shaped support provided at a bottom of the processing chamber;

heating means for heating an underside of a surface-to-be-treated of the object to be treated by light irradiation;

at least three support pins projecting upwardly and inwardly from a circumferential part of the ring-shaped support for supporting the object to be treated thereon;

a vertically movable ring provided about an outer periphery of the ring-shaped support; and at least three transfer pins mounted on the vertically movable ring and projecting inside the ring-shaped support through at least three slits formed in the ring-shaped support so that the transfer pins and the support pins can assume a position where the transfer pins and support pins are at a circumferential interval with respect to one another, wherein the support pins and the transfer pins are transparent members.

2. The film deposition processing device according to claim 1, wherein the support pins and the transfer pins have a rectangular section, and are formed of quartz.

3. The film deposition processing device according to claim 1, wherein a thermocouple is projected inside the ring-shaped support so as to be pressed against the underside of the surface-to-be-treated of the object to be treated supported on the supported pins.

4. The film deposition processing device of claim 1, wherein the support pins and the transfer pins have a circular section, and are formed of quartz.

* * * * *